United States Patent
Zhuang et al.

(10) Patent No.: US 9,899,183 B1
(45) Date of Patent: Feb. 20, 2018

(54) STRUCTURE AND METHOD TO MEASURE FOCUS-DEPENDENT PATTERN SHIFT IN INTEGRATED CIRCUIT IMAGING

(71) Applicant: GLOBALFOUNDRIES INC., Grand Cayman (KY)

(72) Inventors: Lei Zhuang, Ridgefield, CT (US); Timothy A. Brunner, Ridgefield, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 26 days.

(21) Appl. No.: 15/222,096

(22) Filed: Jul. 28, 2016

(51) Int. Cl.
*G03F 9/00* (2006.01)
*G03B 27/62* (2006.01)
*G03B 27/42* (2006.01)
*H01J 37/26* (2006.01)

(52) U.S. Cl.
CPC .................................... *H01J 37/26* (2013.01)

(58) Field of Classification Search
USPC ....... 250/491.1, 492.1, 492.2, 492.22, 492.3; 355/53, 55, 75; 356/399–401
See application file for complete search history.

(56) References Cited

U.S. PATENT DOCUMENTS

| | | | | |
|---|---|---|---|---|
| 4,996,434 A * | 2/1991 | Tanaka | .................. | H01J 37/302 250/492.3 |
| 6,335,784 B2 * | 1/2002 | Mishima | .................. | G03F 7/20 355/53 |
| 6,628,372 B2 * | 9/2003 | McCullough | ....... | G03F 7/70283 355/53 |
| 6,891,598 B2 * | 5/2005 | Van Der Zouw | ..... | G03F 9/7034 355/53 |
| 7,119,886 B2 * | 10/2006 | Leenders | ............ | G03F 7/70258 355/67 |
| 2001/0012098 A1 * | 8/2001 | Mishima | ................... | G03F 7/20 355/53 |
| 2002/0048006 A1 * | 4/2002 | Mishima | ................... | G03F 7/20 355/53 |
| 2002/0115004 A1 * | 8/2002 | McCullough | ....... | G03F 7/70283 430/22 |
| 2004/0179181 A1 * | 9/2004 | Van Der Zouw | ..... | G03F 9/7034 355/67 |
| 2005/0018162 A1 * | 1/2005 | Leenders | ............ | G03F 7/70258 355/67 |

OTHER PUBLICATIONS

Philipsen et al., "Imaging impact of multilayer tuning in EUV masks, experimental validation." Proc. SPIE 9235, Photomask Technology 2014, 92350J (Oct. 15, 2014).

* cited by examiner

*Primary Examiner* — Bernard Souw
(74) *Attorney, Agent, or Firm* — Yuanmin Cai; Hoffman Warnick LLC

(57) ABSTRACT

Various embodiments include measurement structures and methods for measuring integrated circuit (IC) images. In some cases, a measurement structure for use in measuring an image of an IC, includes: a first section having a positive shift spacing pattern; a second section, on an opposite side of the measurement structure, having a negative shift spacing pattern; and a third section having a reference spacing pattern for calibrating a measurement from at least one of the first section or the second section.

20 Claims, 4 Drawing Sheets

STRUCTURE AND METHOD TO MEASURE FOCUS-DEPENDENT PATTERN SHIFT IN INTEGRATED CIRCUIT IMAGING

BACKGROUND

The subject matter disclosed herein relates to integrated circuits. More particularly, the subject matter relates to devices used to measure manufacturing processes in forming integrated circuits.

As integrated circuit (IC) technologies have advanced, the size of these devices has correspondingly decreased. In particular, as devices are reduced in scale to comply with ever-smaller packaging, tighter constraints are applied to their dimensions and spacings.

Smaller ICs call for advanced manufacturing techniques. In the lithography arena, one advanced manufacturing technique is extreme ultraviolet lithography (EUV), which utilizes small wavelengths (e.g., less than approximately 13.5 nanometers in length) to form features. However, EUV suffers from shortfalls, such as pattern-dependent and focus-dependent image shifting due to non-telecentricity of mask illumination optics. These shifts can be significant, given the overlay controls required in advanced IC technology nodes, and accurately measuring these shifts can be difficult.

SUMMARY

Various embodiments include measurement structures and methods for measuring integrated circuit (IC) images. In some cases, a measurement structure for use in measuring an image of an IC, includes: a first section having a positive shift spacing pattern; a second section, on an opposite side of the measurement structure, having a negative shift spacing pattern; and a third section having a reference spacing pattern for calibrating a shift in a printed image of at least one of the first section or the second section of said measurement structure.

A first aspect of the disclosure includes a measurement structure for use in measuring an image of an IC, includes: a first section having a positive shift spacing pattern; a second section, on an opposite side of the measurement structure, having a negative shift spacing pattern; and a third section having a reference spacing pattern for calibrating a shift in a printed image of at least one of the first section or the second section of said measurement structure.

A second aspect of the disclosure includes a method including: applying a measurement structure to a design of an integrated circuit (IC) device, the measurement structure including: a first section having a positive shift spacing pattern; a second section, on an opposite side of the measurement structure, having a negative shift spacing pattern; and a third section having a reference spacing pattern for calibrating shift in a printed image of the design of the IC relative to a measurement from at least one of the first section or the second section; printing the design of the IC device with the measurement structure on a wafer to form the image; and identifying a scaling factor to for the shift in the printed the image of the design of the IC device.

A third aspect of the disclosure includes a measurement structure having: a first section having a positive shift spacing pattern; a second section, on an opposite side of the measurement structure, having a negative shift spacing pattern, wherein the positive shift spacing pattern includes a first set of spacing elements separated from one another by a first distance, and a second set of spacing elements separated from one another by a second distance distinct from the first distance; and a third section having a reference spacing pattern for calibrating a shift in a printed image of at least one of the first section or the second section of the measurement structure, wherein the third section is located between the first section and the second section.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 2:
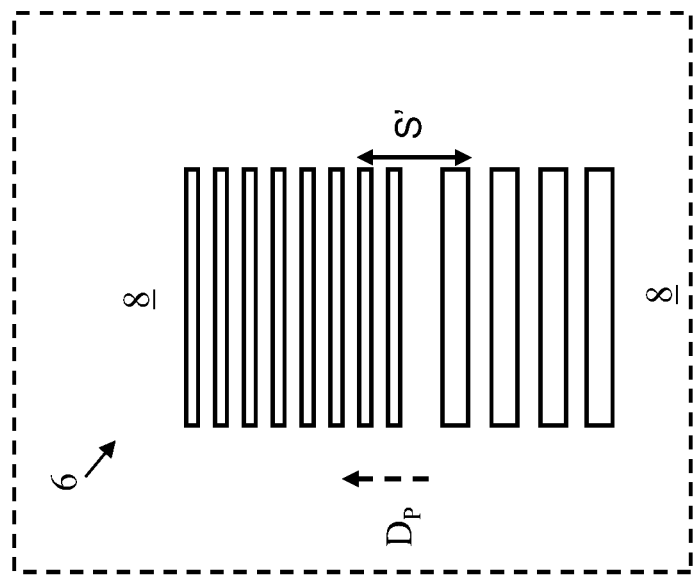
FIG. 2 shows a schematic view of an image on a wafer, formed according to the design of FIG. 1.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to measuring integrated circuit (IC) devices and evaluating methods of manufacturing ICs. More particularly, the subject matter relates to structures and methods for measuring IC devices formed using extreme ultraviolet lithography (EUV).

In contrast to conventional approaches, various embodiments of the disclosure include measurement structures for measuring IC images (e.g., critical dimension scanning electron microscope (CDSEM) images) that include complementary shift spacing patterns and can also include an integrated calibration section. These structures can be used within one IC image to detect relative image shift, e.g., due to pattern-dependent or focus-dependent shift. In contrast to conventional approaches, which require knowledge of the design spacing in an image as compared to the IC design, the measurement structures and associated methods of the various embodiments can be utilized to measure relative shift in an IC image without prior knowledge of the design spacing. This can simplify the measurement process when compared with conventional approaches In the following description, reference is made to the accompanying drawings that form a part thereof, and in which is shown by way of illustration specific embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

Figure 1:
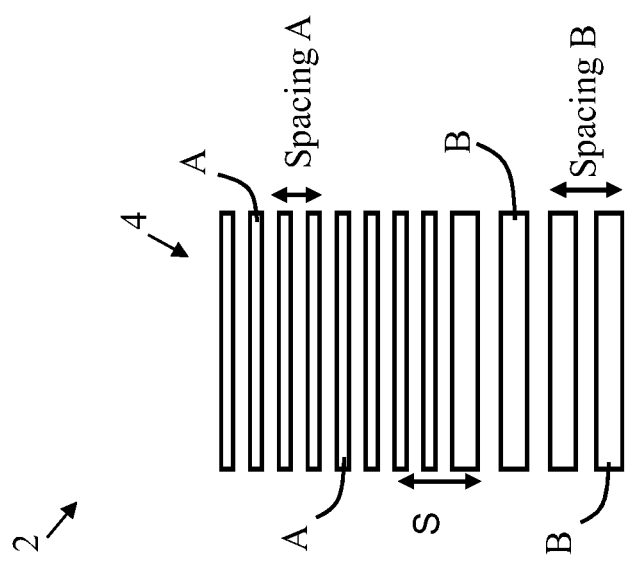
FIG. 1 shows a schematic view of a section of an integrated circuit (IC) design, including line patterns.

FIG. 1 shows a schematic view of a section of an integrated circuit (IC) design 2, including line patterns 4. IC design 2 can include a design formed in a mask, such as a lithography mask, which is used to form one or more portions of an IC or a reference structure in an IC. As shown, IC design 2 includes line patterns 4 of differing sizes, e.g., line A and line B, which are separated from one another by distinct spacings, e.g., spacing A, spacing B. FIG. 2 shows a schematic view of an image 6 on a wafer 8, formed (e.g., printed) according to design 2. In various embodiments, image 6 is a critical dimension scanning electron microscope (CDSEM) image of the IC. As can be seen when comparing image 6 with design 2, the original design 2 has shifted (see dashed arrows indicating shift $D_P$) due to at least one of pattern-dependent shift or focus-dependent shift. This shift is indicated by the cross-line spacing S (design spacing) in FIG. 1 as compared with cross-line spacing S' (actual spacing) in FIG. 2. The difference between S and S' indicates the shift in image 6 as compared with design 2.

Figure 3:
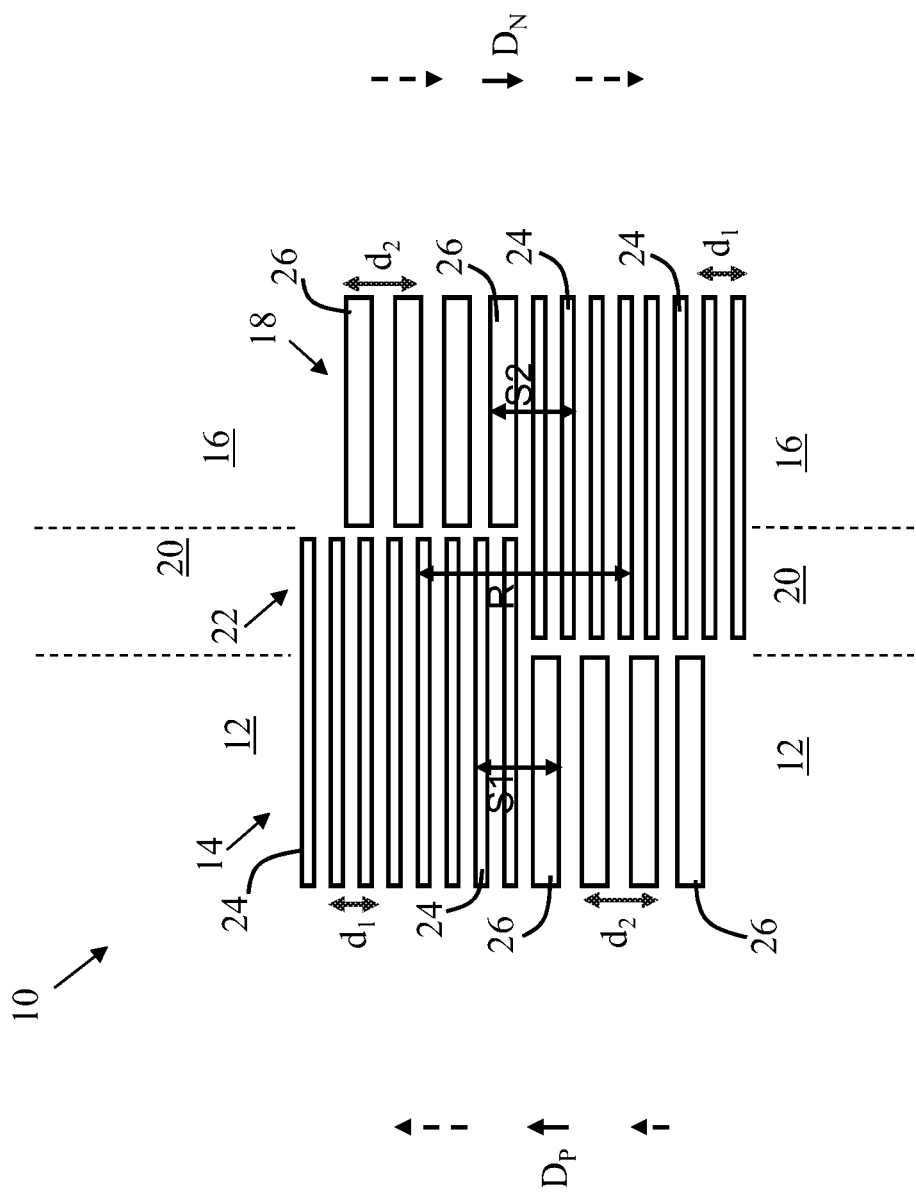
FIG. 3 shows a schematic view of a measurement structure for use in measuring an IC image.

FIG. 3 shows a schematic view of a measurement structure 10 for use in measuring an IC device (e.g., via an image, such as image 6). Measurement structure 10 can be used to measure any conventional IC image formed from a design, e.g., a design on a lithography mask, but may be particularly beneficial in measuring CDSEM images. Measurement structure 10 can be applied to a lithography mask used to form a design (e.g. design 2, FIG. 1), and printed on a wafer along with that design for use in measuring aspects (e.g., shift) in that design when printed. As shown in FIG. 3, measurement structure 10 can include a first section 12 having a positive shift spacing pattern 14, a second section 16 having a negative shift spacing pattern 18, and in some cases, a third section 20 having a reference spacing pattern 22. In some cases, third section 20 is located between first section 12 and second section 16, such that second section 16 is on an opposite side of measurement structure 10 from first section 12. Reference spacing pattern 22 can be configured to calibrate a measurement from at least one of first section 12 or second section 16. In various embodiments, reference spacing pattern 22 can be used to calibrate measurements from both first section 12 and second section 16 in a single image. It is understood that as noted herein, reference spacing pattern 22 may be utilized in separate, e.g., parallel, processes as spacing patterns 14, 18, and in some cases, may be an optional component in measurement structure 10.

In various embodiments, positive shift spacing pattern 14 can include a first set of spacing elements 24 separated from one another by a first distance $d_1$, and a second set of spacing elements 26 separated from one another by a second distance $d_2$. Positive shift spacing pattern 14 transitions from the second set of spacing elements 26 to the first set of spacing elements 24 in a first direction $D_P$. Positive shift spacing pattern 14 is configured to indicate (and provide measurement of) a positive shift (in direction $D_P$) in spacing between lines (e.g., lines A, B, etc., FIG. 1). It is understood that the terms, "positive" and "negative" are only relative terms used to indicate shift of an image (e.g., image 6) relative to a design (e.g., design 2) in a particular direction.

According to various embodiments, negative shift spacing pattern 18 can also include the first set of spacing elements 24 and the second set of spacing elements 26, however, negative shift spacing pattern 18 transitions from second set of spacing elements 26 to first set of spacing elements 24 in a second direction $D_N$, that is opposite the first direction $D_P$. Negative shift spacing pattern 18 is configured to indicate (and provide measurement of) a negative shift (in direction $D_N$ in spacing between lines (e.g., lines A, B, etc., FIG. 1)). It is understood that negative shift spacing pattern 18 is a complementary spacing pattern to positive shift spacing pattern 14, that is, both spacing patterns have a substantially identical configuration, with an opposite orientation relative to one of the shift directions (e.g., $D_P$ or $D_N$).

In various embodiments, a distance (spacing) $S_2$ between spacing elements in the first set of spacing elements 24 and the second set of spacing elements 26 (measured between the sets 24, 26) in the negative shift spacing pattern 18 is equal to a distance (spacing) $S_1$ between corresponding spacing elements in the first set of spacing elements 24 and the second set of spacing elements 26 in the positive shift spacing pattern 14. That is, distances (S1, S2) between a spacing element 26 in second set and an adjacent (or other) spacing element 24 in first set are equal in both negative shift spacing pattern 18 and positive shift spacing pattern 14. A reference spacing R is shown between spacing elements in reference spacing pattern 22.

In various embodiments, reference spacing pattern 22 includes only first set of spacing elements 24, and is located between positive shift spacing pattern 14 and negative shift spacing pattern 18. Reference spacing pattern 22 can be used to calibrate an amount of absolute shift (net result of positive shift in $D_P$ and negative shift in $D_N$) in an image (e.g., image 6) from an IC design (e.g., design 2).

As can be seen in FIG. 3, positive shift spacing pattern 14 is an equal, but opposite spacing pattern relative to negative shift spacing pattern 18. In other words, negative shift spacing pattern 18 may be obtained by rotating 180 degree of positive shift spacing pattern 14. That is, positive shift spacing pattern 14 and negative shift spacing pattern 18 can be used to measure a common feature and determine a relative shift based upon differences between common feature and each of the spacing patterns 14, 18, as described herein.

Figure 4:
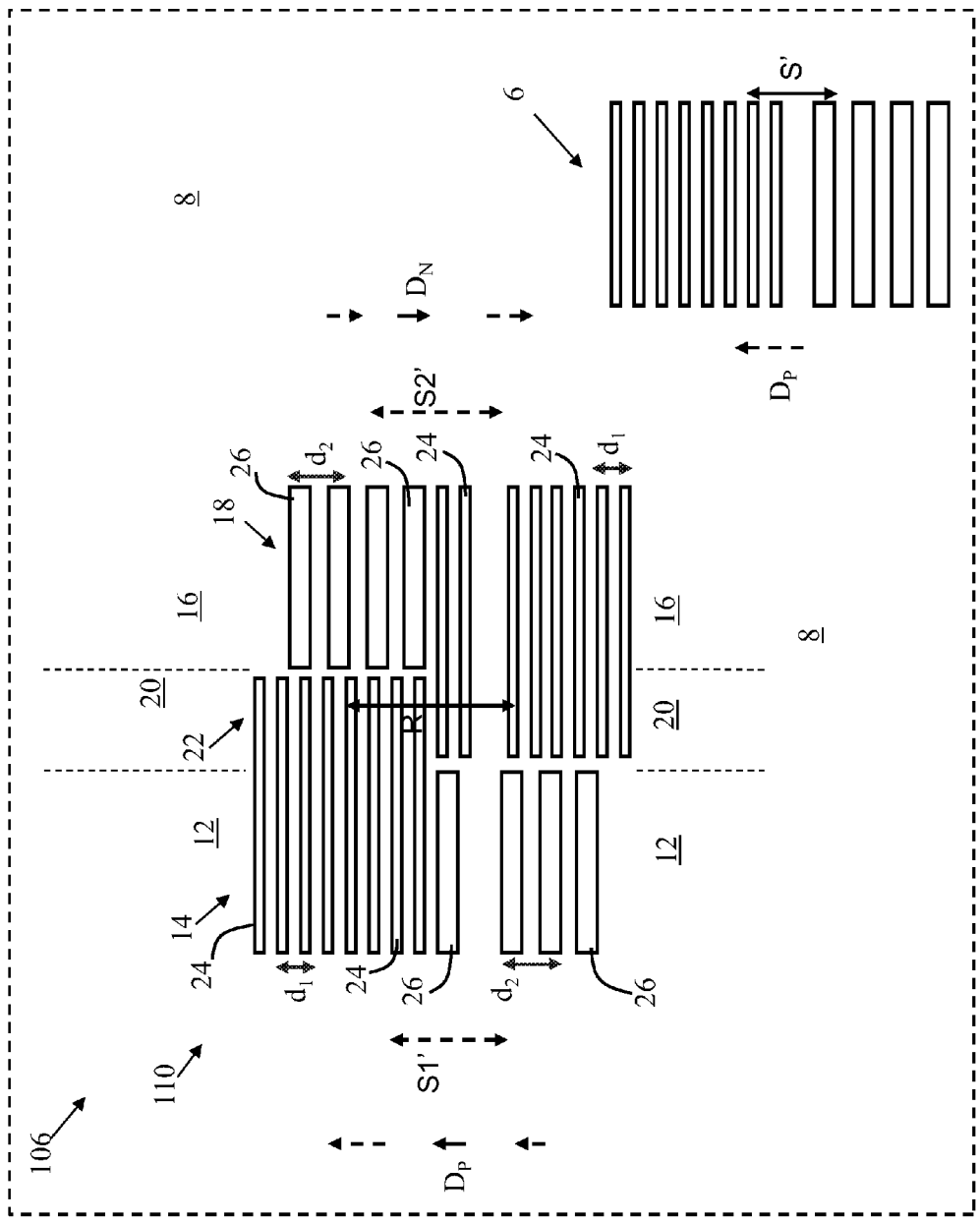
FIG. 4 shows a schematic view of the printed measurement structure of FIG. 3 on a common wafer with the printed image of FIG. 2.

According to various embodiments, measurement structure 10, when being printed together with an image of an IC device on a same wafer, can be used to determine shift in the image of the IC device, e.g., image 6 of IC design 2 as shown in FIGS. 1 and 2. FIG. 4 shows a schematic depiction of an image 106, which includes image 6 of a printed design 2 of IC and a printed image of measurement structure 10, on a wafer 8. It is understood that as described herein, measurement structure 10 can be applied on a mask, e.g., a lithography mask, which is then printed together with other images of IC designs onto a wafer (e.g., wafer 8). The measurement structure 10 can be used to determine relative shift from the design 2 to the image 6, as described herein. It is understood that measurement structure 10 can be applied as a reference structure on the same lithography mask used to form image 6 (where image is formed from design 2), and may be part of a larger image 106 which includes both image 6 and an image 110 of measurement structure 10.

Figure 5:
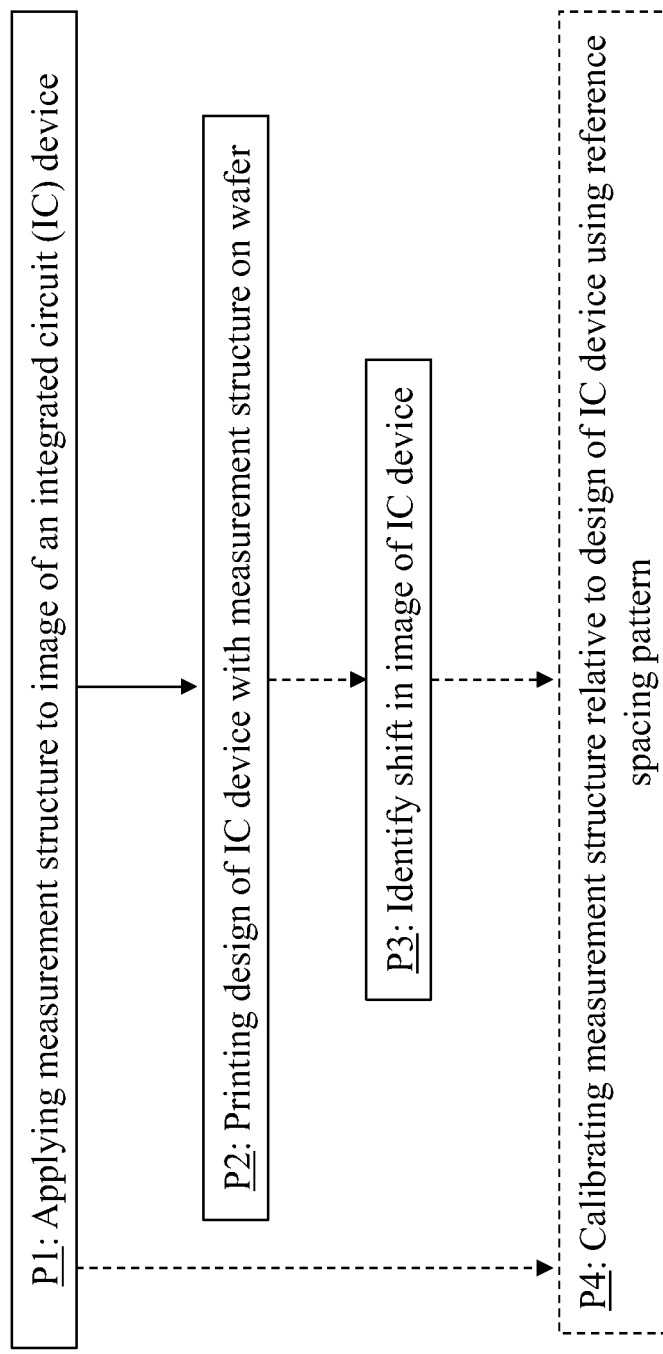
FIG. 5 is a flow diagram illustrating processes in a method according to various embodiments.

FIG. 5 shows a flow diagram illustrating a method of measuring an image 6 of an IC according to various embodiments. It is understood that the processes outlined herein may be performed in a different order than described in some embodiments. Additionally, not all of the processes outlined herein need necessarily be performed according to various embodiments. As shown, the method can include the following processes:

Process P1: applying measurement structure 10 to a design (e.g., IC design 2) of an IC device. This process can include adding or including measurement structure 10 to a lithography mask that is used to print an IC image 6 according to a design (e.g., IC design 2) on a wafer, e.g., by applying measurement structure to the mask or to a design used to form the mask.

Process P2: printing the design of the IC device (e.g., IC design 2) with the measurement structure 10 on a wafer 8. After applying measurement structure to the design of the IC (e.g., IC design 2), that design is printed along with measurement structure 10, forming an image (e.g., image 6) formed from that design and an image 110 of the measurement structure 10. While this process may be performed in a physical printing process, it is also understood that this process can be modeled using computer-based simulation in some alternative embodiments. As shown in FIG. 4, the design of the IC device is printed as image 6 within image 106, and image 110 of measurement structure 10 (FIG. 3) can be used for further analysis of relative shift of the image 6 with respect to design 2.

Process P3: identifying a relative shift in the image 6 (e.g., CDSEM image) of the IC device in response to detecting that the image 6 deviates from the design (e.g., IC design 2). This can include marking or otherwise indicating a relative shift in the design as compared with the image when the relative shift is greater than a tolerance (e.g., a threshold), which may be an absolute value (measurement value threshold) or a relative value (e.g., percentage threshold). As indicated by the image 110 of measurement structure 10 shown in FIG. 4, S1' and S2' indicate relative shifts in the distance between spacing elements in positive shift spacing pattern 14 and negative shift spacing pattern 18, respectively. In various embodiments, in order to determine a core shift of image 6, a process according to one embodiment of present disclosure includes: a) measuring a relative shift (S1') in image 110 of measurement structure 10 with respect to positive shift spacing pattern 14; b) measuring a relative shift (S2') in image 110 with respect to negative shift spacing pattern 18; and c) dividing a difference between the relative shifts by two ((S1'−S2')/2) to determine a relative shift (D) of image 110, which is also indicative of the core shift of image 6.

Process P4 (performed at any time calibration is beneficial, and optionally performed in a separate process, as indicated in dashed lines): calibrating measurement structure 10 relative to the design of the IC device (e.g., IC design 2) using reference spacing pattern 22. In particular cases, this process can include identifying a scaling factor to correct a measurement value in the image 6 of the IC device, using reference spacing pattern 22. This can include, for example, comparing reference spacing pattern 22 with positive shift spacing pattern 14 (to determine S1') and comparing reference spacing pattern 22 with negative shift spacing pattern 18 (to determine S2') (FIG. 1), in order to determine whether a scaling factor exists from the measurement to the original design (e.g., IC design 2). In some cases, an amount of relative shift between reference space pattern 22 and spacing patterns 14, 18 is subtracted or added to a relative shift determined in process P3 for a negative and/or positive relative shift to provide a corrected relative shift value (distance). That is, in some cases, the value of [S1'−S2']/2 may be modified by some scaling factor to account for an overall shift in reference spacing pattern 22 due to printing. For example, if the designed pitch of the reference spacing pattern 22 is 100 nm, but the image 110 (e.g., CDSEM image) measures the pitch of the reference spacing pattern 22 to be 110 nm, a scaling factor (e.g., magnification error) in the measurement is identified, with a ratio of (110/100)=1.1. After determining the relative shift (D) as described with reference to Processes P1-P3, the actual shift can be calculated as the relative shift divided by the scaling factor (e.g., magnification error). In this example, that scaled relative shift is equal to D/1.1. That scaling factor of 1.1 is applied to obtain the true (corrected) value of the relative shift.

As noted herein, measurement structure 10 can be used to effectively measure relative shift (e.g., positive and negative shift), as well as calibrate that relative shift, in a single image. These combined shift-measurement and calibration features in a single structure 10 can help in monitoring and correcting for pattern-dependent and/or focus-dependent relative image shift in IC devices, e.g., in those devices formed using EUV lithography.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A measurement structure for use in calibrating image shift caused by a lithographic patterning process, the measurement structure comprising:
   a first section having a positive shift spacing pattern;
   a second section, on an opposite side of the measurement structure, having a negative shift spacing pattern; and
   a third section having a reference spacing pattern for calibrating a shift in a printed image of at least one of the first section or the second section of said measurement structure.

2. The measurement structure of claim 1, wherein the third section is located between the first section and the second section.

3. The measurement structure of claim 1, wherein the positive shift spacing pattern includes a first set of spacing elements separated from one another by a first distance, and a second set of spacing elements separated from one another by a second distance distinct from the first distance.

4. The measurement structure of claim 3, wherein the reference spacing pattern includes only the first set of spacing elements.

5. The measurement structure of claim 3, wherein the positive shift spacing pattern transitions from the second set of spacing elements to the first set of spacing elements in a first direction.

6. The measurement structure of claim 5, wherein the negative shift spacing pattern includes the first set of spacing elements and the second set of spacing elements.

7. The measurement structure of claim 6, wherein the negative shift spacing pattern transitions from the second set of spacing elements to the first set of spacing elements in a second direction, opposite the first direction, along the measurement structure.

8. The measurement structure of claim 7, wherein a distance between spacing elements in the first set of spacing elements and the second set of spacing elements in the negative shift spacing pattern is equal to a distance between corresponding spacing elements in the first set of spacing elements and the second set of spacing elements in the positive shift pattern.

9. A method comprising:
   applying a measurement structure to a design of an integrated circuit (IC) device, the measurement structure including:
      a first section having a positive shift spacing pattern;
      a second section, on an opposite side of the measurement structure, having a negative shift spacing pattern; and
      a third section having a reference spacing pattern for calibrating shift in a printed image of the design of the IC relative to at least one of the first section or the second section of the measurement structure;
   printing the design of the IC device with the measurement structure on a wafer to form the printed image; and
   identifying a scaling factor to correct for the shift in the printed image of the design of the IC device.

10. The method of claim 9, wherein the third section is located between the first section and the second section.

11. The method of claim 9, wherein the positive shift spacing pattern includes a first set of spacing elements separated from one another by a first distance, and a second set of spacing elements separated from one another by a second distance.

12. The method of claim 11, wherein the reference spacing pattern includes only the first set of spacing elements.

13. The method of claim 11, wherein the positive shift spacing pattern transitions from the first set of spacing elements to the second set of spacing elements in a first direction along the measurement structure.

14. The method of claim 13, wherein the negative shift spacing pattern includes the first set of spacing elements and the second set of spacing elements, wherein the negative shift spacing pattern transitions from the first set of spacing elements to the second set of spacing elements in a second direction, opposite the first direction.

15. The method of claim 9, further comprising identifying a relative shift in the image of the IC device.

16. The method of claim 15, wherein the identifying of the relative shift includes:
   measuring a first spacing (S1') from the positive shift spacing pattern in the printed image; and
   measuring a second spacing (S2') from the negative shift spacing pattern in the printed image.

17. The method of claim 16, wherein the relative shift is calculated according to the formula:

$$\text{Relative shift (RS)} = (S1' - S2')/2.$$

18. A measurement structure comprising:
   a first section having a positive shift spacing pattern;
   a second section, on an opposite side of the measurement structure, having a negative shift spacing pattern,
   wherein the positive shift spacing pattern includes a first set of spacing elements separated from one another by a first distance, and a second set of spacing elements separated from one another by a second distance distinct from the first distance; and
   a third section having a reference spacing pattern for calibrating shift in a printed image from at least one of the first section or the second section of the measurement structure, wherein the third section is located between the first section and the second section.

19. The measurement structure of claim 18, wherein the reference spacing pattern includes only the first set of spacing elements, wherein the positive shift spacing pattern transitions from the first set of spacing elements to the second set of spacing elements in a first direction.

20. The measurement structure of claim 19, wherein the negative shift spacing pattern includes the first set of spacing elements and the second set of spacing elements, wherein the negative shift spacing pattern transitions from the first set of spacing elements to the second set of spacing elements in a second direction, opposite the first direction.

* * * * *